United States Patent
Liu et al.

(10) Patent No.: US 12,156,418 B2
(45) Date of Patent: Nov. 26, 2024

(54) DISPLAY SUBSTRATE AND MANUFACTURING METHOD THEREFOR, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Hong Liu, Beijing (CN); Jingyi Xu, Beijing (CN); Yongqiang Zhang, Beijing (CN); Peng Liu, Beijing (CN); Peirong Huo, Beijing (CN); Wanzhi Chen, Beijing (CN); Xiaochun Xu, Beijing (CN); Jiantao Liu, Beijing (CN); Bo Li, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 327 days.

(21) Appl. No.: 17/761,600

(22) PCT Filed: May 19, 2021

(86) PCT No.: PCT/CN2021/094689
§ 371 (c)(1),
(2) Date: Mar. 18, 2022

(87) PCT Pub. No.: WO2021/249144
PCT Pub. Date: Dec. 16, 2021

(65) Prior Publication Data
US 2022/0367833 A1    Nov. 17, 2022

(30) Foreign Application Priority Data

Jun. 11, 2020   (CN) .......................... 202010528548.9

(51) Int. Cl.
*H10K 50/828* (2023.01)
*H10K 59/65* (2023.01)
(Continued)

(52) U.S. Cl.
CPC ........... *H10K 50/828* (2023.02); *H10K 59/65* (2023.02); *H10K 71/00* (2023.02); *H10K 2102/102* (2023.02); *H10K 2102/103* (2023.02)

(58) Field of Classification Search
None
See application file for complete search history.

(56) References Cited

U.S. PATENT DOCUMENTS

2012/0098076 A1   4/2012  Lee et al.
2013/0306939 A1*  11/2013 Park .................... H01L 27/1259
                                                   438/34
(Continued)

FOREIGN PATENT DOCUMENTS

CN        203871330 U     10/2014
CN        104393024 A     3/2015
(Continued)

OTHER PUBLICATIONS

International Search Report for PCT/CN2021/094689 Mailed Jul. 30, 2021.
(Continued)

*Primary Examiner* — Michelle Mandala
(74) *Attorney, Agent, or Firm* — Ling Wu; Stephen Yang; Ling and Yang Intellectual Property

(57) ABSTRACT

A display substrate and a manufacturing method therefor, and a display device. The display substrate comprises: a substrate, the substrate comprising a blind hole area; a buffer layer covering one side of the substrate; an organic film layer provided on the surface of the buffer layer away from the
(Continued)

substrate and having a first opening in the blind hole area; a passivation layer provided on the side of the organic film layer away from the substrate and having a second opening in the blind hole area; and a transparent electrode layer covering the passivation layer and the buffer layer in the second opening.

8 Claims, 5 Drawing Sheets

(51) Int. Cl.
*H10K 71/00* (2023.01)
*H10K 102/10* (2023.01)

(56) References Cited

U.S. PATENT DOCUMENTS

| | | | |
|---|---|---|---|
| 2019/0288046 A1* | 9/2019 | Park | H10K 50/844 |
| 2021/0202621 A1* | 7/2021 | Liang | H10K 59/1216 |
| 2021/0335930 A1 | 10/2021 | Zheng et al. | |

FOREIGN PATENT DOCUMENTS

| | | |
|---|---|---|
| CN | 109378316 A | 2/2019 |
| CN | 109860266 A | 6/2019 |
| CN | 109950296 A | 6/2019 |
| CN | 110109279 A | 8/2019 |
| CN | 209356818 U | 9/2019 |
| CN | 110473897 A | 11/2019 |
| CN | 111129102 A | 5/2020 |
| CN | 111650787 A | 9/2020 |
| JP | 2000-231101 A | 8/2000 |
| JP | 2004-354950 A | 12/2004 |

OTHER PUBLICATIONS

Office Action dated Sep. 30, 2022 for Chinese Patent Application No. 202010528548.9 and English Translation.

* cited by examiner

DISPLAY SUBSTRATE AND MANUFACTURING METHOD THEREFOR, AND DISPLAY DEVICE

CROSS-REFERENCE TO RELATED APPLICATIONS

The present application is a U.S. National Phase Entry of International Application No. PCT/CN2021/094689 having an international filing date of May 19, 2021, which claims priority to the Chinese patent application No. 202010528548.9, entitled "Display Substrate and Manufacturing Method therefor, and Display Device", filed to the CNIPA on Jun. 11, 2020. The above-identified applications are incorporated into the present application by reference in their entirety.

TECHNICAL FIELD

Embodiments of the present disclosure relate to the field of display structure design technologies, and in particular, to a display substrate and a manufacturing method therefor, and a display device.

BACKGROUND

In some forms of full-screen mobile phones, a transparent area where a camera is placed will be designed in an upper left corner of the screen, which is commonly known as "blind via", and the transmittance of the blind via in products is usually required to be greater than 90%. Therefore, a film structure in the blind via not only requires a material having higher transmittance, but also requires the number of film structures inside the hole as small as possible. There are many film structures in the blind via area, which can easily lead to yellowing phenomenon in the blind via area when lighting, and even seriously affect the shooting effect of the camera.

SUMMARY

The following is a summary for subject matters described herein in detail. The summary is not intended to limit the scope of protection of claims.

In a first aspect, an embodiment of the present disclosure provides a display substrate. The display substrate includes a substrate including a blind via area; a buffer covering one side of the substrate; an organic film layer provided on a surface of the buffer away from the substrate and having a first opening in the blind via area; a passivation layer provided on a side of the organic film layer away from the substrate and having a second opening in the blind via area; and a transparent electrode layer covering the passivation layer and the buffer in the second opening.

In an exemplary embodiment, the substrate further includes a display area, and the transparent electrode layer and a pixel electrode layer in the display area are provided on the same layer.

In an exemplary embodiment, a thickness of the transparent electrode layer ranges from 400 Å to 1000 Å.

In an exemplary embodiment, a material for forming the transparent electrode layer includes indium tin oxide.

In an exemplary embodiment, the display area is provided around the blind via area; the display substrate further includes a functional layer provided between the buffer and the organic film layer and in the display area, wherein the functional layer has a third opening, and an orthographic projection of the blind via area on the substrate falls within an orthographic projection of the third opening on the substrate.

In an exemplary embodiment, an orthographic projection of the first opening on the substrate falls within the orthographic projection of the third opening on the substrate, and the organic film layer is in direct contact with the buffer through the third opening.

In a second aspect, an embodiment of the present disclosure provides a method for manufacturing a display substrate. The method includes forming a buffer on a side of a substrate; forming an organic film layer on a side of the buffer away from the substrate, and forming a first opening in a blind via area of the substrate; forming a passivation layer on a side of the organic film layer away from the substrate, and forming a second opening in the blind via area by dry etching; and forming a transparent electrode layer on a side of the passivation layer away from the substrate and a side of the buffer in the second opening away from the substrate.

In an exemplary embodiment, the transparent electrode layer and a pixel electrode layer in a display area of the substrate are formed by one patterning process.

In an exemplary embodiment, before forming the organic film layer, the method further includes: forming a functional layer on a side of the buffer away from the substrate, wherein the functional layer is formed in the display area.

In an exemplary embodiment, the method further includes: forming a third opening on the functional layer by dry etching, and an orthographic projection of the blind via area on the substrate falling within an orthographic projection of the third opening on the substrate.

In a third aspect, an embodiment of the present disclosure provides a display device, including the display substrate as described in one or more of the above embodiments.

Additional aspects and advantages of the present disclosure will be set forth in part in the following description, and part of which will be apparent from the description, or may be learned through practice of the present disclosure.

After the accompanying drawings and detailed descriptions are read and understood, other aspects may be understood.

BRIEF DESCRIPTION OF DRAWINGS

The above aspects of the present disclosure explain the description of embodiments in conjunction with the following accompanying drawings, in which.

DETAILED DESCRIPTION

Embodiments of the present disclosure will be described below in detail, and a person skilled in the art will understand that the following embodiments are intended to explain the present disclosure and should not be regarded as limitations on the present disclosure. Unless otherwise specified, if technologies or conditions are not explicitly described in the following embodiments, a person skilled in the art may perform acts according to the commonly used technologies or conditions in the art or according to product specifications.

Figure 1:
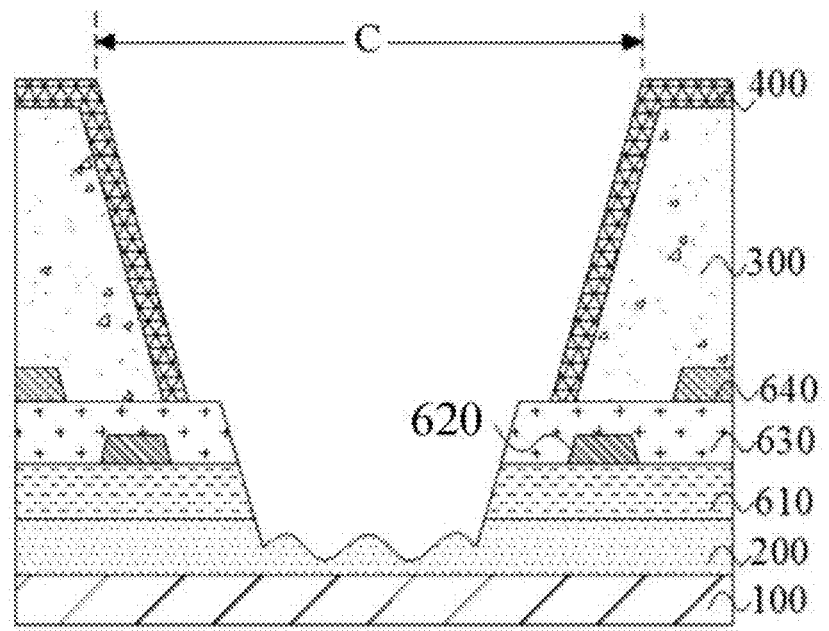
FIG. 1 is a schematic diagram of a cross-sectional structure of a blind via area on a display substrate in some technologies.
Figure 7A:
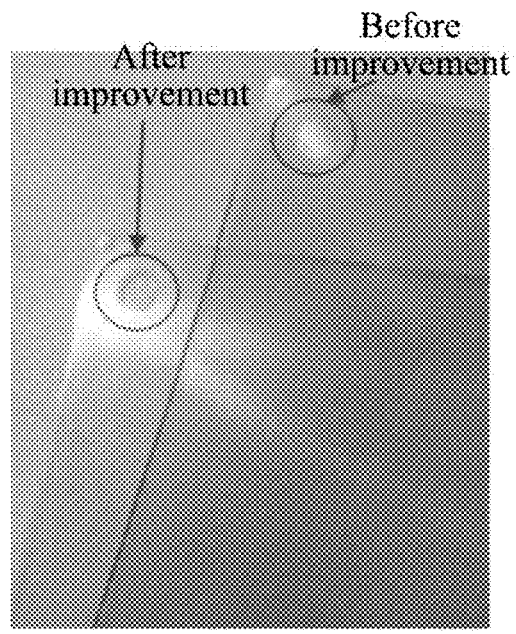
FIG. 7(a) is a contrast photograph of yellowing defect between a display substrate (before improvement) in some technologies and a display substrate (after improvement) provided by an embodiment of the present disclosure.
Figure 7B:
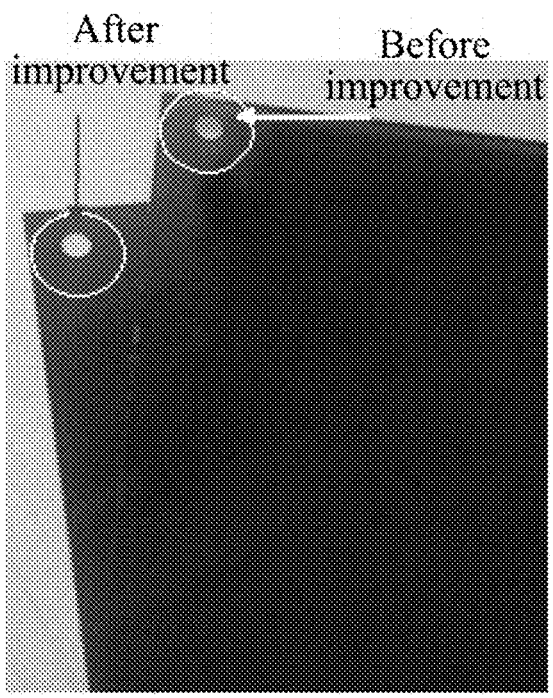
FIG. 7(b) is a contrast photograph of yellowing defect of a display panel after the cell alignment between a display substrate (before improvement) in some technologies and a display substrate (after improvement) provided by an embodiment of the present disclosure.

As shown in FIG. 1, in some display substrates of some technologies, there are many film structures in a blind via area C, and there are irregularities on a surface of a buffer 200, which leads to the phenomenon that the blind via area turns yellow when lighting (for example, see those shown in FIG. 7(a) and FIG. 7(b) before the improvement), and even seriously affects the shooting effect of a camera.

In an aspect of the embodiments of the present disclosure, an embodiment of the present disclosure provides a display substrate.

Figure 2:
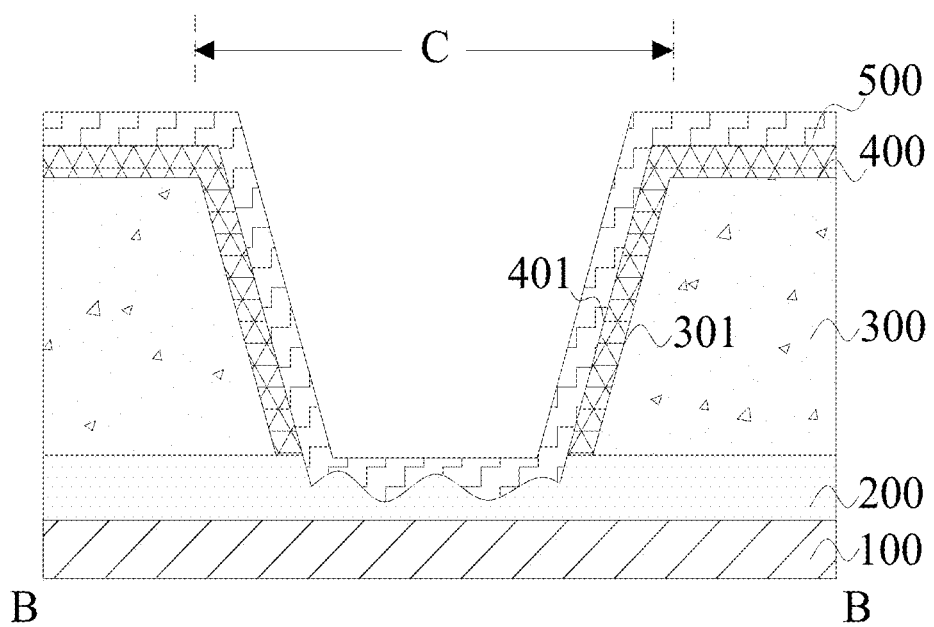
FIG. 2 is a schematic diagram of a cross-sectional structure of a blind via area on a display substrate provided by an embodiment of the present disclosure.

In an exemplary embodiment, as shown in FIG. 2, the display substrate may include a substrate 100, a buffer 200, an organic film layer (PLN) 300, a passivation layer 400 and a transparent electrode layer 500. The substrate 100 includes a blind via area C; the buffer 200 covers one side of the substrate 100; the organic film layer 300 is provided on a surface of the buffer 200 away from the substrate 100, and the organic film layer 300 has a first opening 301 in the blind via area C. The passivation layer 400 is provided on a side of the organic film layer 300 away from the substrate 100, and the passivation layer 400 has a second opening 401 in the blind via area C, and an orthographic projection of the second opening 401 on the substrate 100 may fall within an orthographic projection of the first opening 301 on the substrate 100; and the transparent electrode layer 500 covers the passivation layer 400 and the buffer 200 in the second opening 401.

Figure 6A:
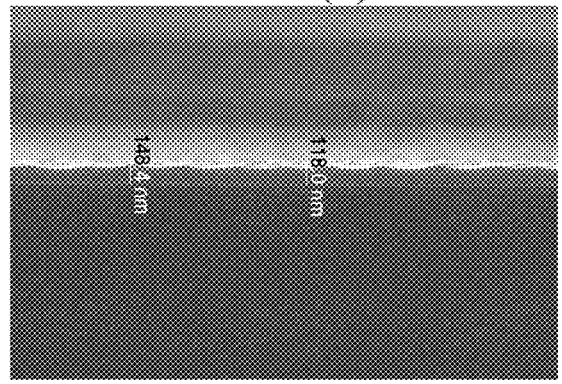
FIG. 6(a) is an electron microscope photograph showing surface uniformity of a blind via area of a display substrate in some technologies.

As shown in FIG. 1, in the blind via area C of the display substrate in some technologies, a dry etching process performed on film layers such as an active layer (ACT) (not shown in the figure), an interlayer dielectric layer (ILD) 630, a data line (SD) 640 and a passivation layer (PVX) 400 will cause the bare buffer 200 in the blind via area C to be over-etched, which will not only make the buffer 200 thinner but also make the uniformity of the buffer 200 poor (for example, as shown in FIG. 6(a), a thickness deviation of the buffer is more than 30 nanometers (nm), thereby affecting the shooting function of the display device. In addition, if the buffer 200 of a light-transmitting area in the center of the blind via area C is removed, only the substrate 100 is left, although the transmittance of the blind via area C is the highest in this case, the dry etching process on a passivation layer 400 or other layers will still cause the problem of over-etching on the surface of the substrate 100, and will also lead to the uneven surface of the substrate 100 made of glass material, thereby the problem of abnormal display will occur.

Figure 6B:
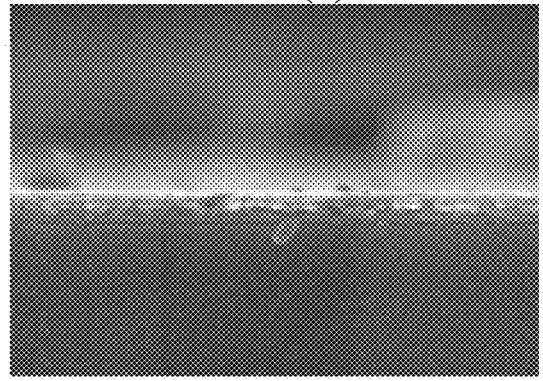
FIG. 6(b) is an electron microscope photograph showing surface uniformity of a blind via area of a display substrate provided by an embodiment of the present disclosure.

Therefore, as shown in FIG. 2, in the display substrate provided by the embodiment of the present disclosure, a flat transparent electrode layer 500 is designed on a surface of the uneven buffer 200 in the blind via area C away from the substrate 100, so that the thickness uniformity in the blind via area C can be better (for example, see FIG. 6(b)), the risk of light interference caused by unevenness such as bumps or burrs can be reduced, and further, the problem of yellowing in the blind via area can be alleviated, and the transmittance of the blind via area C can still reach more than 90%.

Figures 4A, 4B:
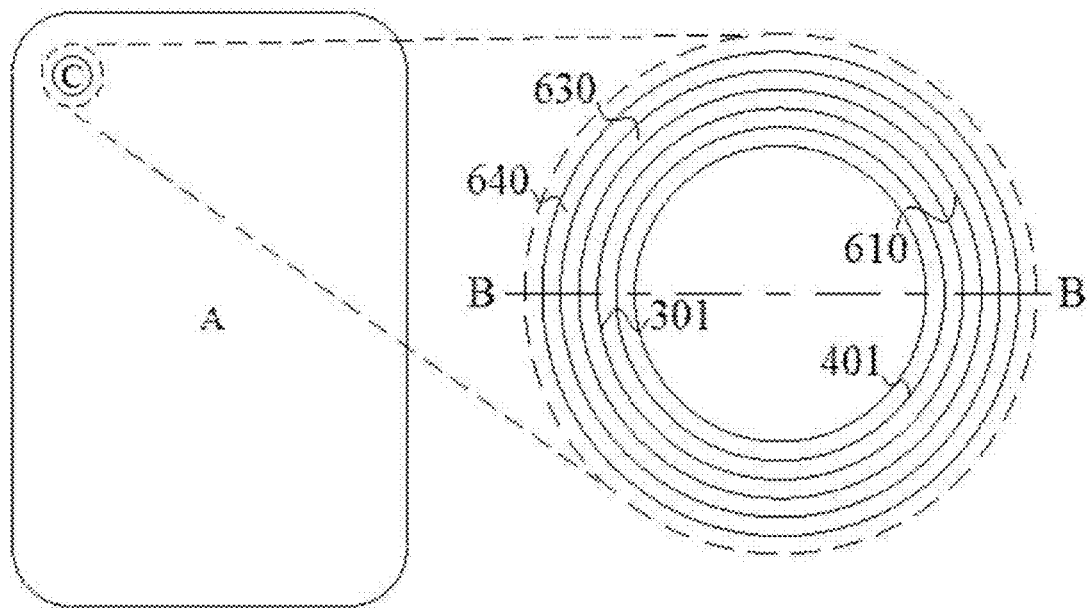
FIG. 4(a) is a schematic diagram of a top-view structure of a display substrate provided by an embodiment of the present disclosure.
FIG. 4(b) is a partial enlarged view of a display substrate provided by an embodiment of the present disclosure.
Figure 5A:
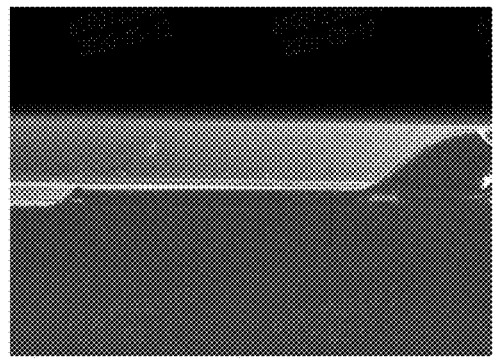
FIG. 5(a) is a cross-sectional electron microscope photograph of a transition area between a blind via area and a display area of a display substrate in some technologies.
Figure 5B:
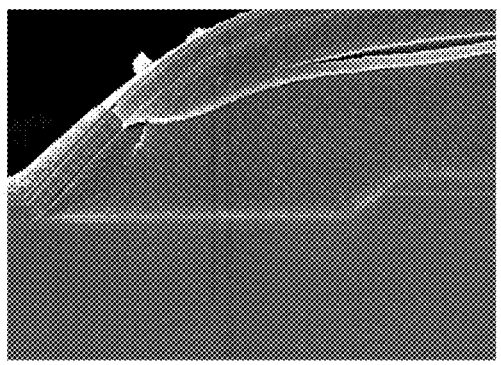
FIG. 5(b) is a cross-sectional electron microscope photograph of a transition area between a blind via area and a display area of a display substrate provided by an embodiment of the present disclosure.

In an exemplary embodiment, as shown in FIG. 4(a), the substrate 100 may further include a display area A. The display area A may be provided around the blind via area C. Furthermore, the transparent electrode layer 500 and a pixel electrode layer in the display area A may be provided on the same layer, that is, the transparent electrode layer 500 and the pixel electrode layer may be made of the same material. Therefore, the transparent electrode layer 500 and the pixel electrode layer may be formed by one patterning process, so that there is no need to add an additional mask for the transparent electrode layer 500, and further, the manufacturing cost of the display substrate can be reduced.

In some exemplary embodiments of the present disclosure, a thickness of the transparent electrode layer 500 may range from 400 Angstroms (Å) to 1000 Angstroms (Å). Therefore, if the transparent electrode layer 500 with the thin thickness of 40 nm to 100 nm is adopted, unevenness on the surface of the buffer 200 in the blind via area C can be covered, and the total thickness of the light-transmitting area in the blind via area C will not be significantly increased, so that it can be guaranteed that the transmittance still reaches more than 90%.

In some exemplary embodiments of the present disclosure, a material for forming the transparent electrode layer 500 may include indium tin oxide (ITO). Therefore, using a conductive metal material with the same transparent material as that of a pixel electrode layer (P-ITO) can not only make the transmittance of the blind via area C higher, but also make the surface of the transparent electrode layer 500 formed by sputtering or other approaches smoother.

Figure 3:
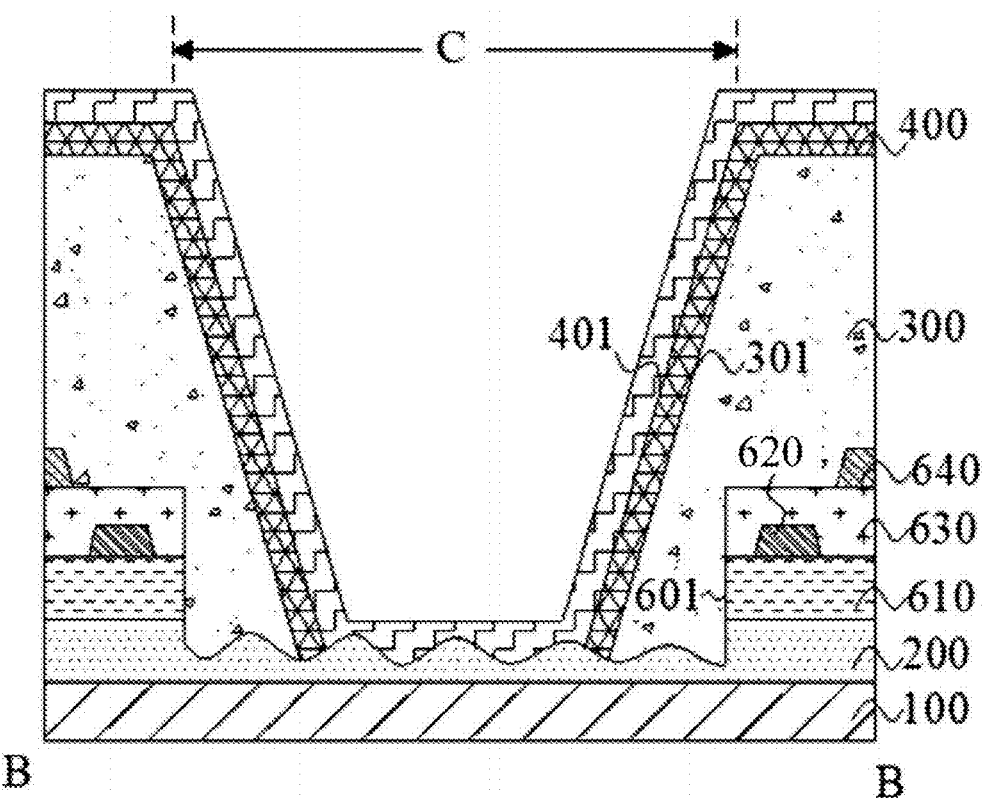
FIG. 3 is a schematic diagram of another cross-sectional structure of a blind via area on a display substrate provided by an embodiment of the present disclosure.

In an exemplary embodiment, as shown in FIG. 3, the display substrate may further include a functional layer. The functional layer is provided between the buffer 200 and the organic film layer 300, and the functional layer is provided in the display area A. For example, the functional layer may include a gate insulating layer 610, a gate line 620, an interlayer dielectric layer 630, a data line 640 and the like, which are stacked on the side of the buffer 200 away from the substrate 100.

In addition, as shown in FIG. 1, in the blind via area C of the display substrate in some technologies, the gate insulating layer (GI) 610 and the interlayer dielectric layer (ILD) 630 form a stepped structure, and small holes of the interlayer dielectric layer (ILD) 630 are wrapped by large holes of the passivation layer (PVX) 400 and the organic film layer (PLN) 300, thereby causing multi-layer interference in the film structure of Buffer+GI+ILD in the blind via area C and resulting in yellowing of the display. In the display substrate provided by the embodiment of the present disclosure, as shown in FIG. 3, the interlayer dielectric layer (ILD) 630 and the gate insulating layer (GI) 610 are far away from the blind via area C, that is, the functional layer composed of the interlayer dielectric layer (ILD) 630 and the gate insulating layer (GI) 610 has a third opening 601, and an orthographic projection of the blind via area C on the substrate 100 falls in an orthographic projection of the third opening 601 on the substrate 100. Therefore, the third opening 601 of the functional layer between the organic film layer 300 and the buffer 200 may be enlarged beyond the blind via area C, so that the light interference among multiple film layers can be effectively reduced, and further, the risk of yellowing and other defects in the blind via area of the display substrate can be lower.

In some exemplary embodiments of the present disclosure, as shown in FIG. 3, an orthographic projection of the first opening 301 on the substrate 100 falls within an orthographic projection of the third opening 601 on the substrate 100, and the organic film layer 300 is in direct contact with the buffer 200 through the third opening 601. Therefore, the third opening 601 of the functional layer may be far away from the blind via area C, and a step of the functional layer may be covered by the organic film layer 300, so that the light interference among multiple film layers can be more effectively reduced, and further, the risk of yellowing phenomenon in the blind via area of the display substrate can be lower.

In an exemplary embodiment, a transmittance test is carried out on the blind via area C of the display substrate provided by the embodiment of the present disclosure. Take an array substrate (TFT) as an example, only a photoresist (OC) film layer is formed on one side of the color filter substrate (CF), and polyimide (PI) liquid, seal glue and liquid crystal (LC) are used for aligning the cell, and then the transmittance test is performed on the assembled display panel. When the blind via area C of the display substrate provided by the embodiment of the present disclosure only has the substrate and the buffer, the average light transmittance of the blind via area C may be 92.42%. When the blind via area C of the display substrate provided by the embodiment of the present disclosure has the substrate, buffer and transparent electrode layer of ITO, the average light transmittance of the blind via area C may be 92.42%. When the blind via area C of the display substrate provided by the embodiment of the present disclosure has the substrate, buffer, passivation layer and transparent electrode layer of ITO, the average light transmittance of the blind via area C is 89.49%.

Therefore, according to the display substrate provided by the embodiment of the present disclosure, although the surface of the total buffer of the display substrate in the blind via area will be etched into unevenness by the dry etching of the passivation layer, by forming a flat transparent electrode layer on the surface of the buffer, the uniformity in the blind via area can be better, the yellowing problem in the blind via area can be alleviated, and it can be guaranteed that the transmittance of the blind via area reaches more than 90%.

Figure 8:
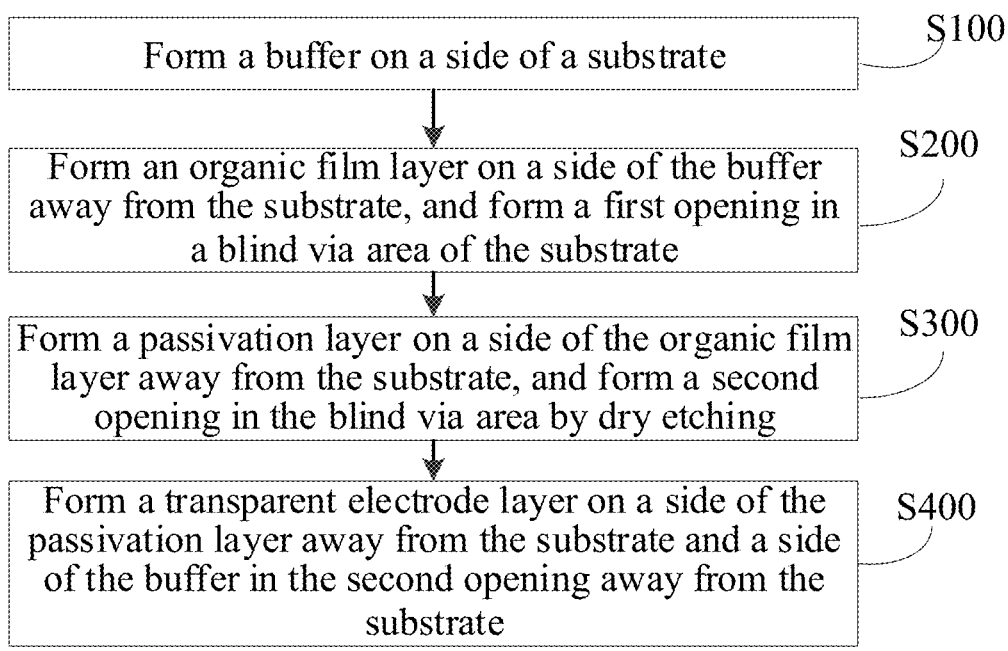
FIG. 8 is a flowchart of a method for manufacturing a display substrate provided by an embodiment of the present disclosure.

In another aspect of the present disclosure, embodiments of the present disclosure provide a method for manufacturing a display substrate. As shown in FIG. 8, the manufacturing method may include the following acts S100-S400.

In S100, a buffer is formed on a side of a substrate.

In act S100, an entire buffer 200 is formed on the side of the substrate 100. The substrate 100 may include a blind via area C and a display area A, and the display area A is provided around the blind via area C.

In some exemplary embodiments of the present disclosure, after the act S100 and before the act S200, a functional layer may be formed on a side of the buffer 200 away from the substrate 100, and the functional layer is formed in the display area A. For example, a gate insulating layer 610, a gate line 620, an interlayer dielectric layer 630 and a data line 640 may be sequentially formed on the surface of the buffer 200 away from the substrate 100, and the third opening 601 may be etched out by dry etching, and an orthographic projection of the blind via area C on the substrate falls within an orthographic projection of the third opening 601 on the substrate 100. Therefore, the opening 601 of the functional layer between the organic film layer 300 and the buffer 200 may be enlarged beyond the blind via area C, so that light interference among multiple film layers can be reduced, and further, the risk of yellowing phenomenon in the blind via area of the display substrate can be lower.

In S200, an organic film layer is formed on a side of the buffer away from the substrate, and a first opening is formed in a blind via area of the substrate.

In act S200, the organic film layer 300 is formed on the side of the buffer 200, formed in act S100, away from the substrate 100. For example, it may be continued to form the organic film layer 300 on the surface of the functional layer away from the substrate 100; and a first opening 301 is formed in the blind via area C.

In some exemplary embodiments of the present disclosure, an orthographic projection of the formed first opening 301 on the substrate 100 falls within an orthographic projection of the third opening 601 on the substrate 100, and the organic film layer 300 may be in direct contact with the buffer 200 through the third opening 601. Therefore, the opening 601 of the functional layer may be far away from the blind via area C, and a step of the functional layer may be covered by the organic film layer 300, so that the light interference among multiple film layers can be more effectively reduced, and further, the risk of yellowing phenomenon in the blind via area of the display substrate can be lowered.

In S300, a passivation layer is formed on a side of the organic film layer away from the substrate, and a second opening is formed in the blind via area by dry etching.

In act S300, the passivation layer 400 is formed on a side of the organic film layer 300, formed in act S200, away from the substrate 100, and a second opening 401 is formed in the blind via area C by dry etching.

In S400, a transparent electrode layer is formed on a side of the passivation layer away from the substrate and a side of the buffer in the second opening away from the substrate.

In act S400, a transparent electrode layer 500 is formed on a side of the passivation layer 400, formed in act S300, away from the substrate 100 and a side of the buffer 200 in the second opening 402 away from the substrate 100, so that the uniformity of the film layer in a light-transmitting area in the blind via area C is better, and the flatness is better than that of the manufacturing process in some technologies.

In some exemplary embodiments of the present disclosure, the transparent electrode layer 500 and a pixel electrode layer in the display area A of the substrate 100 may be formed by one patterning process. Therefore, there is no need to add an additional mask for the transparent electrode layer 500, thereby reducing the manufacturing cost of the display substrate. Furthermore, a thickness of the transparent electrode layer 500 may range from 400 Angstroms (Å) to 1000 Angstroms (Å), and a material for forming the transparent electrode layer 500 may include indium tin oxide (ITO).

Therefore, according to the method for manufacturing the display substrate provided by the embodiment of the present disclosure, although the surface of the buffer in the blind via area is uneven due to the dry etching used in forming the second opening of the passivation layer, a flat transparent electrode layer may be formed on the surface of the buffer in the second opening, so that the risk of yellowing phenomenon in the blind via area of the manufactured display substrate can be lower, and further, and the color effect of the shooting function of the display device can be more realistic.

In another aspect of the embodiments of the present disclosure, an embodiment of the present disclosure provides a display device, including the display substrate as described in one or more of the above exemplary embodiments.

In an exemplary embodiment, the type of the display device is not particularly limited, such as a display screen, a TV, a mobile phone, a tablet computer or a smart watch, and a person skilled in the art can make corresponding selections according to actual use requirements of the display device, which will not be repeated here.

In addition, besides the display substrate, the display device may also include other necessary components and structures. Take a OLED display screen as an example, such as a touch panel, a shell, a control circuit board or a power supply line. A person skilled in the art can make corresponding supplements according to the functions of the display device, which will not be repeated here.

According to the display device provided by the embodiments of the present disclosure, the risk of yellowing phenomenon in the blind via area on the display substrate is lower, so that the shooting effect of the camera provided in the blind via area can be better, and further, the color of the shooting function of the display device can be more realistic. A person skilled in the art can understand that the features and advantages described above for the display substrate are still applicable to the display device, which will not be repeated here.

In the description of the present disclosure, orientation or position relationships indicated by terms "center", "longitudinal", "transverse", "length", "width", "thickness", "upper", "lower", "front", "back", "left", "right", "vertical", "horizontal", "top", "bottom", "inside", "outside", "clockwise", "counterclockwise", "axial", "radial", "circumferential" and the like are based on the orientation or position relationships shown in the drawings, and are only for the convenience of description of the present disclosure and simplification of the description, but are not intended to indicate or imply that the mentioned device or element must have a specific orientation, or be constructed and operated in a particular orientation, and therefore they should not be construed as limitations on the present disclosure.

In the descriptions of the present disclosure, unless otherwise specified and defined, terms "mounting", "coupling", "connection" and "fixing" should be generally understood. For example, the connection may be fixed connection or detachable connection or integral connection; the connection may be mechanical connection or electrical connection; and the connection may be direct connection or indirect connection through an intermediate medium; or the connection may be communication inside two elements or interaction between the two elements. A person skilled in the art may understand the specific meanings of the above terms in the present disclosure according to actual situations.

In addition, the terms "first", "second" and "third" are used for descriptive purposes only and cannot be interpreted as indicating or implying relative importance or implicitly indicating the number of technical features indicated. Thus, the features defined by "first", "second" and "third" may explicitly or implicitly include at least one of the features. In the description of the present disclosure, the meaning of "a plurality of" refers to "at least two", such as "two" or "three", unless otherwise explicitly defined.

In the above description, the description with reference to the terms "an embodiment", "some embodiments", "examples", "exemplary embodiment", or "some examples" or the like means that the features, structures, materials, or characteristics described in conjunction with the embodiments or examples are included in at least one embodiment or example of the present disclosure. In this description, the schematic expression of the above terms does not necessarily refer to the same embodiment or example. Moreover, the described features, structures, materials, or characteristics may be combined in an appropriate manner in any one or more of embodiments or examples. In addition, without a conflict, a person skilled in the art may combine different embodiments or examples described in this description and the features of different embodiments or examples.

Although the embodiments of the present disclosure are shown and described above, it can be understood that the above embodiments are exemplary and cannot be interpreted as limitations to the present disclosure. A person skilled in the art may change, modify, replace, and vary the above embodiments within the scope of the present disclosure.

The invention claimed is:

1. A display substrate, comprising:
a substrate comprising a blind via area;
a buffer covering one side of the substrate;
an organic film layer provided on a surface of the buffer away from the substrate and having a first opening in the blind via area;
a passivation layer provided on a side of the organic film layer away from the substrate and having a second opening in the blind via area; and
a transparent electrode layer covering the buffer in the second opening and the passivation layer;
wherein the substrate further comprises a display area, and the transparent electrode layer and a pixel electrode layer in the display area are provided on a same layer;
wherein the display area is provided around the blind via area; the display substrate further comprises a functional layer provided between the buffer and the organic film layer and in the display area, wherein the functional layer has a third opening, and an orthographic projection of the blind via area on the substrate falls within an orthographic projection of the third opening on the substrate;
wherein an orthographic projection of the first opening on the substrate falls within the orthographic projection of the third opening on the substrate, and the organic film layer is in direct contact with the buffer through the third opening.

2. The display substrate according to claim 1, wherein a thickness of the transparent electrode layer ranges from 400 Å to 1000 Å.

3. The display substrate according to claim 1, wherein a material for forming the transparent electrode layer comprises indium tin oxide.

4. A method for manufacturing a display substrate, comprising:

forming a buffer on a side of a substrate;

forming a display area on the substrate, and providing a transparent electrode layer and a pixel electrode layer in the display area on a same layer;

forming a functional layer on a side of the buffer away from the substrate, wherein the functional layer is formed in the display area;

forming an organic film layer on a side of the buffer away from the substrate, and forming a first opening in a blind via area of the substrate; wherein the display area is provided around the blind via area;

forming a passivation layer on a side of the organic film layer away from the substrate, and forming a second opening in the blind via area by dry etching; and forming a transparent electrode layer on a side of the passivation layer away from the substrate and a side of the buffer in the second opening away from the substrate;

forming a third opening on the functional layer by dry etching, wherein an orthographic projection of the blind via area on the substrate falls within an orthographic projection of the third opening on the substrate;

wherein an orthographic projection of the first opening on the substrate falls within the orthographic projection of the third opening on the substrate, and the organic film layer is in direct contact with the buffer through the third opening.

5. The method according to claim 4, wherein the transparent electrode layer and the pixel electrode layer in the display area of the substrate are formed by one patterning process.

6. A display device, comprising the display substrate according to claim 1.

7. A display device, comprising the display substrate according to claim 2.

8. A display device, comprising the display substrate according to claim 3.

* * * * *